(12) United States Patent
Yang et al.

(10) Patent No.: US 8,816,372 B2
(45) Date of Patent: Aug. 26, 2014

(54) LED PACKAGE HAVING A COVERING PORTION MADE OF SILICON-TITANATE RESIN FOR SEALING A JOINT AND METHOD FOR MAKING THE SAME

(75) Inventors: Chia-Chiang Yang, Hsinchu (TW); Wen-Liang Tseng, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 233 days.

(21) Appl. No.: 13/337,125

(22) Filed: Dec. 25, 2011

(65) Prior Publication Data

US 2012/0305960 A1 Dec. 6, 2012

(30) Foreign Application Priority Data

Jun. 1, 2011 (CN) .......................... 2011 1 0145798

(51) Int. Cl.
*H01L 33/00* (2010.01)
(52) U.S. Cl.
USPC .. 257/98; 257/100; 257/E33.06; 257/E33.062
(58) Field of Classification Search
None
See application file for complete search history.

(56) References Cited

U.S. PATENT DOCUMENTS

| 4,224,213 | A | 9/1980 | Johnson et al. | |
|---|---|---|---|---|
| 2006/0102917 | A1* | 5/2006 | Oyama et al. | 257/99 |
| 2007/0170454 | A1* | 7/2007 | Andrews | 257/100 |
| 2010/0213479 | A1 | 8/2010 | Li et al. | |
| 2011/0176573 | A1* | 7/2011 | Tan et al. | 372/50.1 |

FOREIGN PATENT DOCUMENTS

| CN | 101127377 A | 2/2008 |
|---|---|---|
| TW | 201032352 A1 | 9/2010 |

* cited by examiner

*Primary Examiner* — Michael Jung
(74) *Attorney, Agent, or Firm* — Novak Druce Connolly Bove + Quigg LLP

(57) ABSTRACT

An LED package includes a substrate, an electrode structure, an LED die, a packaging portion, and a covering portion. The electrode structure is formed on the substrate. The LED die is mounted on the substrate, and electrically connected to the electrode structure. The packaging portion covers the LED die. The covering portion surrounds a periphery of the LED package and seals a joint between the substrate, the electrode structure and the packaging portion. The covering portion is made of silicone-titanate resin with reactive monomers, wherein the reactive monomers comprises more than 60% of heptane, 7.0% to 13.0% of allyltrimethoxysilane, 5.0% to 10.0% of tetrabutyl titanate, and less than 0.1% of tetramethoxysilane.

14 Claims, 4 Drawing Sheets

LED PACKAGE HAVING A COVERING PORTION MADE OF SILICON-TITANATE RESIN FOR SEALING A JOINT AND METHOD FOR MAKING THE SAME

BACKGROUND

1. Technical Field

The present disclosure generally relates to light emitting diode (LED) packages and method for making the same.

2. Description of Related Art

Generally, an LED package includes a substrate, an electrode structure formed on the substrate, an LED die arranged on the substrate and electrically connected to the electrode structure, and an encapsulation formed on the substrate to cover the LED die. In addition, there may be a reflective cup formed around the LED die, with the encapsulation filled therein covering the LED die. However, due to that there are usually gaps remained between the substrate and the encapsulation or the reflective cup, moisture and dust can infiltrate into the LED package through the gaps, thereby leading to poor reliability and short service life of the LED package.

Therefore, it is necessary to provide an LED package which can overcome the above shortcomings.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure.

DETAILED DESCRIPTION

Reference will now be made to the drawings to describe the present LED packages, and method for making the LED packages, in detail.

Figure 1:
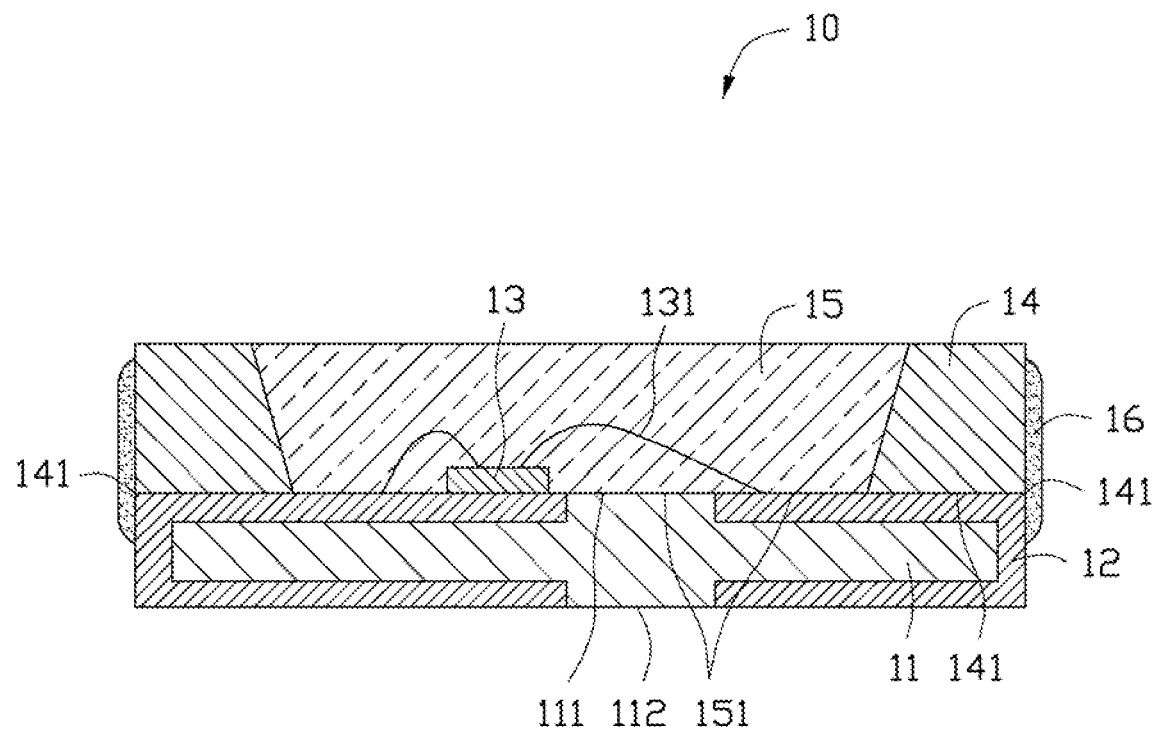
FIG. 1 is a schematic, cross-sectional view of an LED package in accordance with a first embodiment of the present disclosure.
Figure 2:
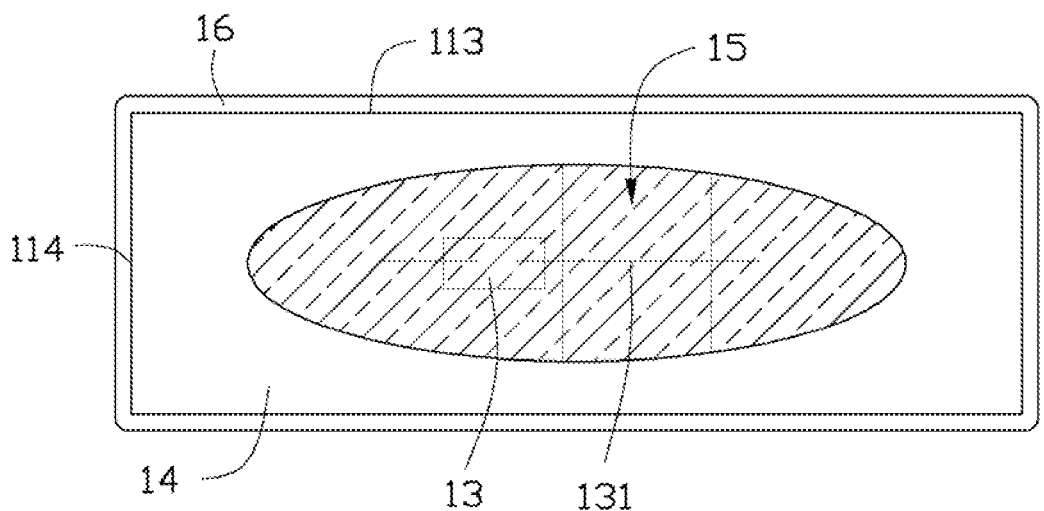
FIG. 2 is a schematic, top view of the LED package of FIG. 1.

Referring to FIG. 1 and FIG. 2, an LED package 10 of a first embodiment includes a substrate 11, two electrodes 12 formed on the substrate 11, an LED die 13 mounted on the substrate 11, an packaging portion, and a covering portion 16 surrounding the LED package 10. In this embodiment, the packaging portion includes an encapsulation 15 covering the LED die 13 and a reflective cup 14 disposed on the substrate 11 and a periphery of the encapsulation 15. Thus, the reflective cup 14 surrounds the encapsulation 15 and the LED die 13.

The substrate 11 includes a first surface 111 and a second surface 112 opposite to the first surface 111. In this embodiment, the substrate 11 is rectangular and thin. The substrate 11 also includes two opposite first sides 113 and two opposite second sides 114 perpendicular to the first sides 113. Alternatively, the first surface 111 can be circular or other desired shape according to actual requirements.

The electrodes 12 are formed on the substrate 11, and spaced from each other. Each electrode 12 extends from a central portion of the first surface 111 to the second surface 112, via a respective second side 114. The electrodes 12 are electrically insulated from each other. The electrodes 12 are made of metal with good electric conductivity, such as gold, silver, copper, platinum, aluminum, nickel, tin, magnesium or an alloy thereof. In this embodiment, top sides of the electrodes 12 are coplanar with the first surface 111 of the substrate 11, and bottom sides of the electrodes 12 are coplanar with the second surface 112 of the substrate 11.

The LED die 13 is mounted on one of the two electrodes 12, and electrically connected to the electrodes 12 by two metal wires 131. The LED die 13 can also be mounted on and electrically connected to the two electrodes 12 by flip-chip bonding. Alternatively, the LED die 13 can be arranged on the first surface 111 of the substrate 11 and electrically connected to the two electrodes 12 by the two metal wires 131.

The reflective cup 14 is formed on an outer edge of the first surface 111 and outer ends of the electrodes 12 on the first surface 111. The reflective cup 14 surrounds the LED die 13, and receives the LED die 13 therein. A first joint 141 is formed between the bottom surface of the reflective cup 14 and the first surface 111 of the substrate 11 and the electrodes 12 on the first surface 111.

The encapsulation 15 is filled in the reflective cup 14. The encapsulation 15 is over the substrate 11 and covers the LED die 13 and the metal wires 131. The encapsulation 15 is made of silicone or epoxy resin. The encapsulation 15 includes light transmissive fluorescent materials evenly distributed therein. The fluorescent materials are, for example, YAG (yttrium aluminum garnet), TAG (terbium aluminum garnet), silicate, nitride, nitrogen oxides, phosphide and sulfide. The encapsulation 15 protects the LED die 13 from moisture and dust and helps the conversion of color of the light from the LED die 13 to a desired color. A second joint 151 is formed between the bottom surface of the encapsulation 15 and the first surface 111 of the substrate 11 and the electrodes 12 on the first surface 111. In this embodiment, the first joint 141 and the second joint 151 level with each other.

The covering portion 16 is disposed at the periphery of the LED package 10 to seal the joints 141, 151 between the reflective cup 14 and the electrodes 12 and the substrate 11 and between encapsulation 15 and the electrodes 12 and the substrate 11. In this embodiment, the covering portion 16 is annular and adhered on outer surfaces of the reflective cup 14 and substrate 11, with a top edge thereof higher than the joint 141 but lower than a top of the reflective cup 14 and a bottom edge thereof lower than the joint 141 but higher than the second surface 112 of the substrate 11.

The covering portion 16 is made of silicone-titanate resin. The silicone-titanate resin has reactive monomers including heptane, allyltrimethoxysilane, tetrabutyl titanate, and tetramethoxysilane. The percentage of the reactive monomers in the silicone-titanate resin by weight is more than 60% of heptane, 7.0% to 13.0% of allyltrimethoxysilane, 5.0% to 10.0% of tetrabutyl titanate, and less than 0.1% of tetramethoxysilane. The covering portion 16 has good waterproofing quality and prevents moisture and dust from infiltrating into the LED package 10.

Figure 3:
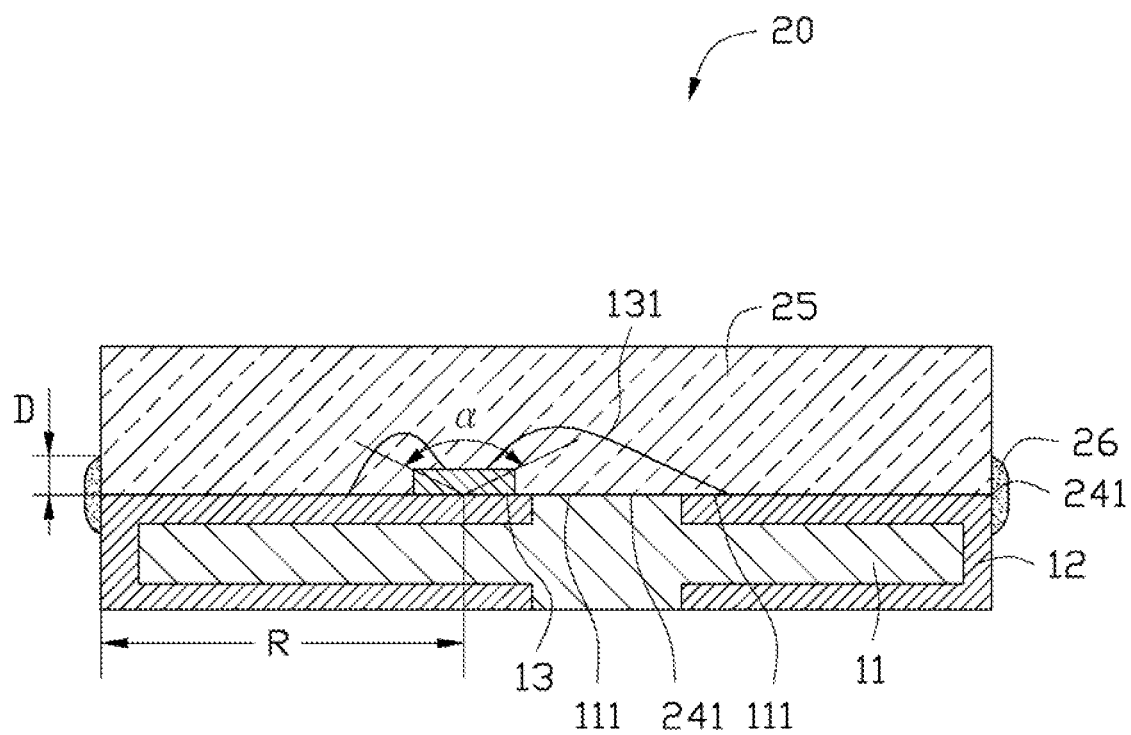
FIG. 3 is a schematic, cross-sectional view of an LED package in accordance with a second embodiment of the present disclosure.

Referring to FIG. 3, an LED package 20 of a second embodiment includes a substrate 11, two electrodes 12 formed on the substrate 11, an LED die 13 mounted on the substrate 11, a packaging portion, and a covering portion 26 surrounding the LED package 10. In this embodiment, the packaging portion is an encapsulation 25 covering the LED die 13.

The encapsulation 25 covers the electrodes 12 and the first surface 111 of the substrate 11 directly. A joint 241 is formed between the encapsulation 25 and the electrodes 12 on the first surface 111 of the substrate 11 and first surface 111 of the substrate 11. In this embodiment, the encapsulation 25 is made of silicone.

The covering portion 26 surrounds the periphery of the LED package 20, and seals the joint 241. The covering portion 26 is made of silicone-titanate resin. The reactive monomers and the percentage by weight thereof can be the same as the first embodiment. Preferably, a distance "D" from the joint 241 to a top end of the covering portion 26 is so designed that the covering portion 26 does not block the radiation of light of the LED die 13. Specifically, if a dispersion angle of the radiation of the light of the LED die 13 is α, a distance between the LED die 13 and the covering portion 26 is R, the distance D between the top end of the covering portion 26 and the joint 241 should satisfy:

$$D \leq R*\tan(90-\alpha/2)$$

For example, if the dispersion angle of the radiation of the light of the LED die 13 is 120°, the distance "D" should not exceed R*tan 30°. As such, the covering portion 26 sits below a projection angle of the light radiated by the LED die 13. In an alternative embodiment, even if the distance "D" is more than R*tan(90−α/2) and the covering portion 26 blocks a part of the radiation of the light of the LED die 13, due to the refractive index of the covering portion 26 being smaller than that of the encapsulation 25, the light extraction efficiency may still be high enough. The bonding force between silicone-titanate resin and silicone resin is high, so the waterproof quality of the LED package 20 can be improved by disposing the covering portion 26 directly on the joint of the substrate 11, the electrodes 12, and the encapsulation 25.

Figure 4:
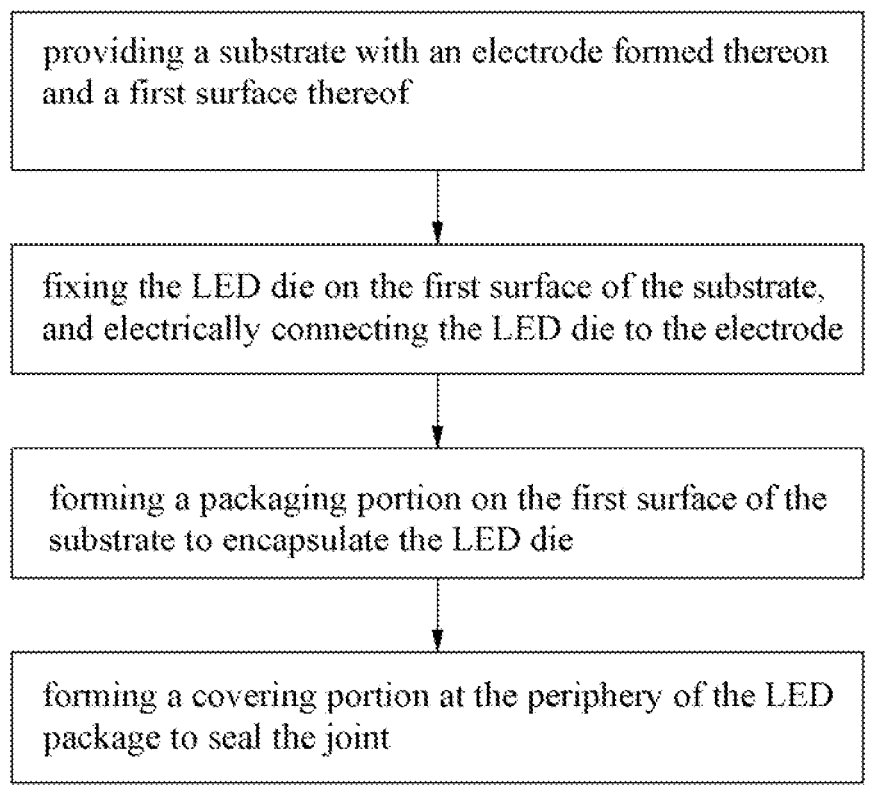
FIG. 4 is a flow chart of a method for forming an LED package in accordance with an embodiment of the present disclosure.

Referring to FIG. 4, the present disclosure further provides a method for making the LED package. The method includes following steps:

Step 1: providing a substrate 11 with two electrodes 12 formed thereon, wherein the substrate 11 is rectangular and comprises a first surface 111 and a second surface 112 opposite to the first surface 111;

Step 2: fixing the LED die 13 on the first surface 111 of the substrate 11, and electrically connecting the LED die 13 to the electrodes 12;

Step 3: forming an encapsulation 15 on the substrate 11 to cover the LED die 13; and Step 4: forming a covering portion 16 on the periphery of the LED package, the covering portion 16 covering the joint 141 between the substrate 11 and the encapsulation 15.

The electrode 12 can be made by electroplating, electroforming, or evaporating and so on.

The LED die 13 is fixed on the substrate 11 by gluing and wire bonded to the electrodes 12.

The covering portion 16 (26) is made of silicone-titanate resin and secured to the LED package 10 (20) by spraying or soaking process. Spraying can make the process simple and save the quantity of the material needed to form the covering portion 16 (26). The thickness, size and position of the covering portion 16 (26) depend on the parameters of the spraying of the liquid silicone-titanate. The liquid silicone-titanate is directly sprayed to the periphery of the LED package 10 (20) to form the covering portion 16 (26). The steps of soaking includes: sealing up the LED package 10 (20) with a protective cover except for the portion where the covering portion 16 (26) is to be formed, immersing said LED package 10 (20) into liquid silicone-titanate resin; taking out and heating said LED package 10 (20) till the liquid silicone-titanate resin is cured, and removing the protective cover to leave the covering portion 16 (26) on the LED package 10 (20).

In summary, the covering portion 16 (26) is disposed at the joint between the substrate 11, the electrodes 12 and the packaging portion which are connected with each other. Due to the covering portion 16 (26) having good waterproof property, the moisture and dust can hardly infiltrate into the LED package 10 (20) through the covering portion 16 (26). Thus, the LED die 13 can be effectively protected from being damaged by moisture and dust. Furthermore, the bonding force between the covering portion 16 and the reflective cup 14 is so large that the covering portion 16 help reinforcing the joint between the reflective cup 14 and the substrate 11 and the electrodes 12.

It is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. An LED package comprising:
   a substrate comprising a first surface and a second surface opposite to the first surface;
   an electrode structure formed on the first surface of the substrate;
   an LED die mounted on the substrate and electrically connected to the electrode structure;
   a packaging portion covering the LED die; and
   a covering portion surrounding the periphery of the substrate and sealing a joint between the substrate, the electrode structure and the packaging portion, the covering portion being made of silicone-titanate resin with reactive monomers, the reactive monomers comprising more than 60% of heptane, 7.0% to 13.0% of allyltrimethoxysilane, 5.0% to 10.0% of tetrabutyl titanate, and less than 0.1% of tetramethoxysilane.

2. The LED package of claim 1, wherein the packaging portion comprises an encapsulation covering the LED die on the substrate.

3. The LED package of claim 2, wherein the electrode structure comprises two spaced electrodes each extending from the first surface to the second surface of the substrate.

4. The LED package of claim 3, wherein the covering portion is adhered on outer surfaces of the substrate and the encapsulation, a top edge of the covering portion being higher than the joint but lower than a top of the encapsulation, a bottom edge of the covering portion being lower than the joint but higher than the second surface of the substrate.

5. The LED package of claim 4, wherein a distance D between the top edge of the covering portion and the joint satisfy: $D \leq R*\tan(90-\alpha/2)$, wherein α is a dispersion angle of radiation of light of the LED die, and R is a distance between the LED die and the covering portion.

6. The LED package of claim 3, wherein the refractive index of the covering portion is smaller than that of the encapsulation.

7. The LED package of claim 2, wherein the packaging portion further comprises a reflective cup surrounding the encapsulation, the bottom surface of the reflective cup engaged with the first surface of the substrate, the joint being defined between the reflective cup and the electrode structure and the substrate.

8. The LED package of claim 7, wherein the covering portion covers the joint and extends from the joint to the substrate and the encapsulation upwardly and downwardly without reaching the second surface and the top surface of the reflective cup.

9. An LED package comprising:
a substrate comprising a first surface and a second surface opposite to the first surface;
an electrode formed on the substrate and extending from the first surface to the second surface;
an LED die mounted on the substrate and electrically connected to the electrode;
a packaging portion covering the LED die; and
a covering portion surrounding a periphery of the substrate and sealing up a joint between the substrate, the electrode and the packaging portion, the covering portion being made of silicone-titanate resin with reactive monomers of heptane, allyltrimethoxysilane, tetrabutyl titanate, and tetramethoxysilane.

10. A method for making an LED package, comprising:
providing a substrate having first and second electrodes;
mounting an LED die to the substrate and electrically connecting the LED die with the first and second electrodes;
forming a packaging portion on the substrate to encapsulate the LED die therein;
forming a covering portion to cover a joint between the substrate, the electrodes and the packaging portion, the covering portion being made of silicone-titanate resin with the reactive monomers of more than 60% of heptane, 7.0% to 13.0% of allyltrimethoxysilane, 5.0% to 10.0% of tetrabutyl titanate, and less than 0.1% of tetramethoxysilane.

11. The method of claim 10, wherein the covering portion comprises a top edge higher than the joint but lower than a top of the LED package and a bottom edge lower than the joint but higher than a bottom of the LED package.

12. The method of claim 10, wherein the packaging portion is essentially consisted of an encapsulation doped with fluorescent material.

13. The method of claim 10, wherein the packaging portion comprises an encapsulation and a reflective cup surrounding the encapsulation.

14. The method of claim 10, wherein the covering portion is made by one of spraying process and soaking process.

* * * * *